United States Patent [19]

Ha et al.

[11] Patent Number: 5,399,236
[45] Date of Patent: Mar. 21, 1995

[54] METHOD FOR MANUFACTURING A SEMICONDUCTOR DEVICE

[75] Inventors: Jae H. Ha, Ichonkun; Hee K. Park, Kangnam, both of Rep. of Korea

[73] Assignee: Hyundai Electronics Industries Co., Ltd., Kyoungkido, Rep. of Korea

[21] Appl. No.: 88,187

[22] Filed: Jul. 6, 1993

[30] Foreign Application Priority Data

Jul. 10, 1992 [KR] Rep. of Korea ............. 1992-12265

[51] Int. Cl.$^6$ ............................ B44C 1/22; C23F 1/00
[52] U.S. Cl. .................................. 156/643; 156/655; 156/656; 156/659.1; 156/665; 252/79.1; 437/229; 437/245
[58] Field of Search ............. 156/643, 646, 656, 659.1, 156/665, 655; 252/79.1; 204/192.32, 192.35, 192.36; 437/194, 225, 228, 229, 245

[56] References Cited

U.S. PATENT DOCUMENTS

| | | | |
|---|---|---|---|
| 4,372,807 | 8/1983 | Vossen et al. | 156/643 |
| 4,581,101 | 4/1986 | Senoue et al. | 156/643 |
| 5,068,007 | 11/1991 | Rogers et al. | 156/643 |
| 5,246,888 | 9/1993 | Miyamoto | 437/245 |

*Primary Examiner*—William Powell
*Attorney, Agent, or Firm*—Darby & Darby

[57] ABSTRACT

A method for manufacturing a semiconductor device including the steps of forming a photoresist pattern on a metal layer and forming a wiring by etching a metal composed of aluminum or aluminum alloy with plasma including chlorine and eliminating said photoresist pattern while simultaneously eliminating residual chlorine on the wiring by adding alkyl ketone or alkyl ether in an oxygen plasma ash chamber. The present invention can provide a method for manufacturing a semiconductor device, which can eliminate residual chlorine and a photoresist pattern by adding alkyl ketone or alkyl ether so that wiring corrosion may be prevented.

4 Claims, No Drawings

METHOD FOR MANUFACTURING A SEMICONDUCTOR DEVICE

BACKGROUND OF INVENTION

1. Field of the Invention The present invention relates to a method for manufacturing a semiconductor device and particularly to a method for protecting a metal from being corroded by residual chlorine in a wiring process.

2. Description of the prior Art

Generally, A method for manufacturing semiconductor device forming a wiring is as follows.

First, a metal layer composed of aluminum or aluminum alloy is formed.

Next, a photoresist pattern is formed on the entire structure. Thereafter, using plasma including chlorine, a pattern of a wiring is formed by etching a metal layer which is exposed and a photoresist pattern is eliminated.

However, when a wiring is exposed to air, aluminum or aluminum alloy is corroded by residual chlorine. Therefore, four methods are conventionally used, to eliminate residual chlorine. The first method is cleaning the residual chlorine by deionized water. The second method is vaporizing residual chlorine using a thermal process.

The third method is encapsulating residual chlorine by forming a polymer on a metal layer, using CHF plasma, etc.

The fourth method is replacing residual chlorine by fluorine, using CF plasma. However, the first method cannot be protected against corrosion and the second method has problems such as hillocks, segregation, and recrystalization when the temperature is more than 300° C.

The third method has the problem that the aluminum alloy of a wiring is corroded since the polymer is often broken, in the case where the wiring is exposed at air. The fourth method induces excessive damage of the oxide layer and undercut of the barrier metal layer such as TiN or TiW since over-etching using CF plasma is required so as to eliminate residual chlorine perfectly.

So, it is well known that by placing an oxygen plasma ash chamber in a metal etch apparatus, a photoresist layer is eliminated and simultaneously aluminum oxide is formed so as to protect a metal line from corrosion using a plasma in situ process before the wiring is exposed at air.

However, this method cannot effectively eliminate residual chlorine on a wiring.

SUMMARY OF THE INVENTION

It is an object of the present invention to provide an improved method of manufacturing a semiconductor device, which can, effectively eliminate a photoresist pattern and residual chlorine.

The present invention provides a method for manufacturing a semiconductor device comprising the steps of forming a photoresist pattern on a metal layer composed of aluminum or aluminum alloy and forming a wiring by etching a metal composed of aluminum or aluminum alloy with plasma including chlorine and eliminating said photoresist pattern and simultaneously eliminating residual chlorine on a wiring by adding alkyl ketone or alkyl ether in an oxygen plasma ash chamber.

DETAILED DESCRIPTION OF THE INVENTION

Similar to a conventional method, a metal layer composed of aluminum or aluminum alloy is deposited on an insulation layer and the photoresist layer is placed on the aluminum layer and the photoresist pattern is formed using lithography technique. Thereafter, a wiring is formed by etching the exposed metal layer composed of aluminium or aluminum alloy with plasma including chlorine.

Next, according to the present invention, a photoresist pattern and residual chlorine are effectively eliminated by adding alkyl ketone

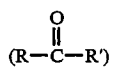

or alkyl etcher (R-O-R') in an oxygen plasma ash chamber. Said alkyl radical R,R' is $C_nH_{2n}$ or $C_nH_{2n+1}$, for example $CH_3$, $C_2H_5$, $C_3H_7$, $C_2H_6$. The principle of the present invention is as follows.

Alkyl ketone

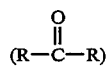

or alkyl ether (R-O-R') is separated by plasma according to formula (1), (2)

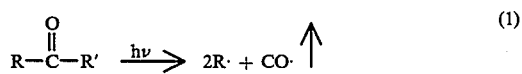

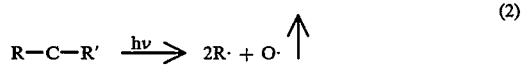

The resulting alkyl radical (2R) reacts on the residual chlorine on the metal line, therefore, 2RCl is prepared and vaporized according to formula (3).

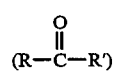

Oxygen radical (0.) which is obtained in formula (2) reacts with the carbon of the photoresist, resulting in that, CO or $CO_2$ is prepared.

Moreover, the resulting oxygen radical (0.) reacts with the aluminum, therefore, an aluminium oxidation layer ($Al_2O_3$) is effectively formed on the metal line surface. As described above, the present invention can protect a metal layer from corrosion since the obtained alkyl radical eliminates residual chlorine by adding alkyl ketone

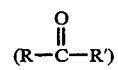

or alkyl ether (R-O-R'). Also, the present invention can eliminate residual chlorine without loss of oxide layer and affecting the of metal line profile.

What is claimed is:

1. A method for manufacturing a semiconductor device comprising the steps of:

forming a photoresist pattern on a metal layer comprising one of aluminum and aluminum alloy;

forming wiring by etching said metal layer with plasma including chlorine; and removing said photoresist pattern and residual chlorine on said wiring by adding alkyl ketone in an oxygen plasma ash chamber.

2. A method according to 1, wherein an alkyl radical of said alkyl ketone added in said oxygen plasma ash chamber is one of $CH_3$, $C_2H_5$, $C_3H_7$, and $C_2H_6$.

3. A method for manufacturing a semiconductor device comprising the steps of:

forming photoresist pattern on a metal layer comprising one of aluminum and aluminum alloy;

forming wiring by etching said metal layer with plasma including chlorine; and removing said photoresist pattern and residual chlorine on said wiring by adding alkyl ether in an oxygen plasma ash chamber.

4. A method according to 3, wherein an alkyl radical of said alkyl ether added in said oxygen plasma ash chamber is one of $CH_3$, $C_2H_5$, $C_3H_7$, and $C_2H_6$.

* * * * *